United States Patent [19]
Jia

[11] Patent Number: 5,912,068
[45] Date of Patent: Jun. 15, 1999

[54] EPITAXIAL OXIDES ON AMORPHOUS SIO₂ ON SINGLE CRYSTAL SILICON

[75] Inventor: Quanxi Jia, Los Alamos, N.Mex.

[73] Assignee: The Regents of the University of California, Los Alamos, N.Mex.

[21] Appl. No.: 08/760,545

[22] Filed: Dec. 5, 1996

[51] Int. Cl.⁶ .............................. B32B 9/04; H01L 23/58; H01L 21/324; B05D 3/02
[52] U.S. Cl. ..................... 428/210; 257/636; 257/644; 257/646; 257/650; 427/376.2; 427/376.3; 427/376.6; 427/376.7; 427/383.3; 428/216; 428/336; 428/446; 428/697; 428/699; 428/701; 428/702; 428/481; 428/762; 428/770; 428/787
[58] Field of Search ..................................... 428/450, 697, 428/700, 702, 210, 216, 336, 446, 699, 701; 437/238, 244, 247, 248, 132; 257/636, 644, 646, 650; 427/376.2, 376.3, 376.6, 376.7, 383.3; 438/481, 762, 770, 787

[56] References Cited

U.S. PATENT DOCUMENTS

| | | | |
|---|---|---|---|
| 4,661,176 | 4/1987 | Manasevit | 148/175 |
| 4,888,820 | 12/1989 | Chen et al. | 361/313 |
| 4,912,087 | 3/1990 | Aslam et al. | 505/1 |
| 5,173,474 | 12/1992 | Connell et al. | 505/1 |
| 5,358,925 | 10/1994 | Connell et al. | 505/235 |

OTHER PUBLICATIONS

Q. X. Jia et al., Philosophical Magazine Letters, 1995, vol. 72, No. 6, pp. 385–391.
Q. X. Jia et al., Appl. Phys. Lett., 1990, vol.68, No. 8, pp. 1069–1071.
D. K. Fork et al., Appl. Phys. Lett., 1990, vol. 57, No. 11, 1161–1163.
Th. Matthee et al., Appl. Phys. Lett., 1992, vol. 61, No. 10, pp. 1240–1242.
P. Legagneux et al., Appl. Phys. Lett., 1988, vol. 53, No. 16, pp. 1506–1508.
A. Mogro–Campero et al., Appl. Phys. Lett., 1988, vol. 52, No. 24, pp. 2068–2070.
X. D. Wu et al., Appl. Phys. Lett., 1991, vol. 58, No. 19, pp. 2165–2167.
Susumu Horita et al., Thin Solid Films, 1993, vol. 229, pp. 17–23.
A. Bardel et al., J. Mater. Res., 1993, vol. 8, No. 9, pp. 2112–2127.

*Primary Examiner*—Rabon Sergent
*Attorney, Agent, or Firm*—Bruce H. Cottrell

[57] ABSTRACT

A process for forming a structure including an epitaxial layer of a oxide material such as yttria-stabilized zirconia on a thick layer of amorphous silicon dioxide having a thickness of at least about 500 Angstroms on a single crystal silicon substrate and the resultant structures derived therefrom are provided.

17 Claims, 5 Drawing Sheets

EPITAXIAL OXIDES ON AMORPHOUS SIO$_2$ ON SINGLE CRYSTAL SILICON

FIELD OF THE INVENTION

The present invention relates to a structure including, e.g., an epitaxial oxide layer on an amorphous silicon dioxide layer on a single crystal silicon substrate, and to a process for preparing such a structure. This invention is the result of a contract with the Department of Energy (Contract No. W-7405-ENG-36).

BACKGROUND OF THE INVENTION

Yttrium stabilized zirconia (YSZ) has been previously deposited on single crystal silicon. On that intermediate structure have been deposited layers of materials such as YBCO or $Bi_4Ti_3O_{12}$ with ferroelectric materials such as PZT thereupon. Problems with these structures have involved the interface between the YSZ and silicon. Diffusion of zirconium into the silicon layer has been previously reported. While an intermediate silicon dioxide layer can gradually be formed between the YSZ and the silicon due to gradual oxidation, it is relatively thin, i.e., less than about 100 Angstroms.

It is an object of the present invention to provide a structure including an epitaxial oxide layer on an amorphous silicon dioxide layer on a single crystal silicon substrate.

It is a further object of the invention to provide a process for forming a structure including an epitaxial oxide layer on an amorphous silicon dioxide layer on a single crystal silicon substrate.

It is a still further object of the invention to provide a structure further including additional epitaxial oxide layers deposited upon the epitaxial oxide layer on an amorphous silicon dioxide layer, such additional epitaxial oxide layers of materials such as high temperature superconductor materials, dielectric materials, or conductive metallic oxide materials and the like.

Yet another object of the present invention is to provide a structure including a thick layer of amorphous silicon dioxide of at least about 500 Angstroms between the epitaxial oxide material and the single crystal silicon substrate.

Still another object of the invention is to provide a process for forming a structure including a thick layer of amorphous silicon dioxide of at least about 500 Angstroms between the epitaxial oxide material and the single crystal silicon substrate, where the thick layer of amorphous silicon dioxide is formed in situ between the epitaxial oxide material and the single crystal silicon substrate.

SUMMARY OF THE INVENTION

To achieve the foregoing and other objects, and in accordance with the purposes of the present invention, as embodied and broadly described herein, the present invention provides a structure including a single crystal silicon substrate, an amorphous layer of silicon dioxide adjacent the single crystal silicon substrate, the amorphous layer having a thickness of at least about 500 Angstroms, and, a layer of epitaxial oxide material adjacent the amorphous layer of silicon dioxide.

The present invention further provides a process of forming a structure including a single crystal silicon substrate, an amorphous layer of silicon dioxide adjacent the single crystal silicon substrate, and, a layer of epitaxial oxide material adjacent the amorphous layer of silicon dioxide, the process including depositing a layer of epitaxial oxide material on a single crystal silicon substrate to form an intermediate structure, and, heating the intermediate structure in an oxygen-containing atmosphere at temperatures from about 900° C. to about 1200° C. whereby a layer of amorphous silicon dioxide is formed in situ between the single crystal silicon substrate and the layer of epitaxial oxide material.

DETAILED DESCRIPTION

Figure 1:
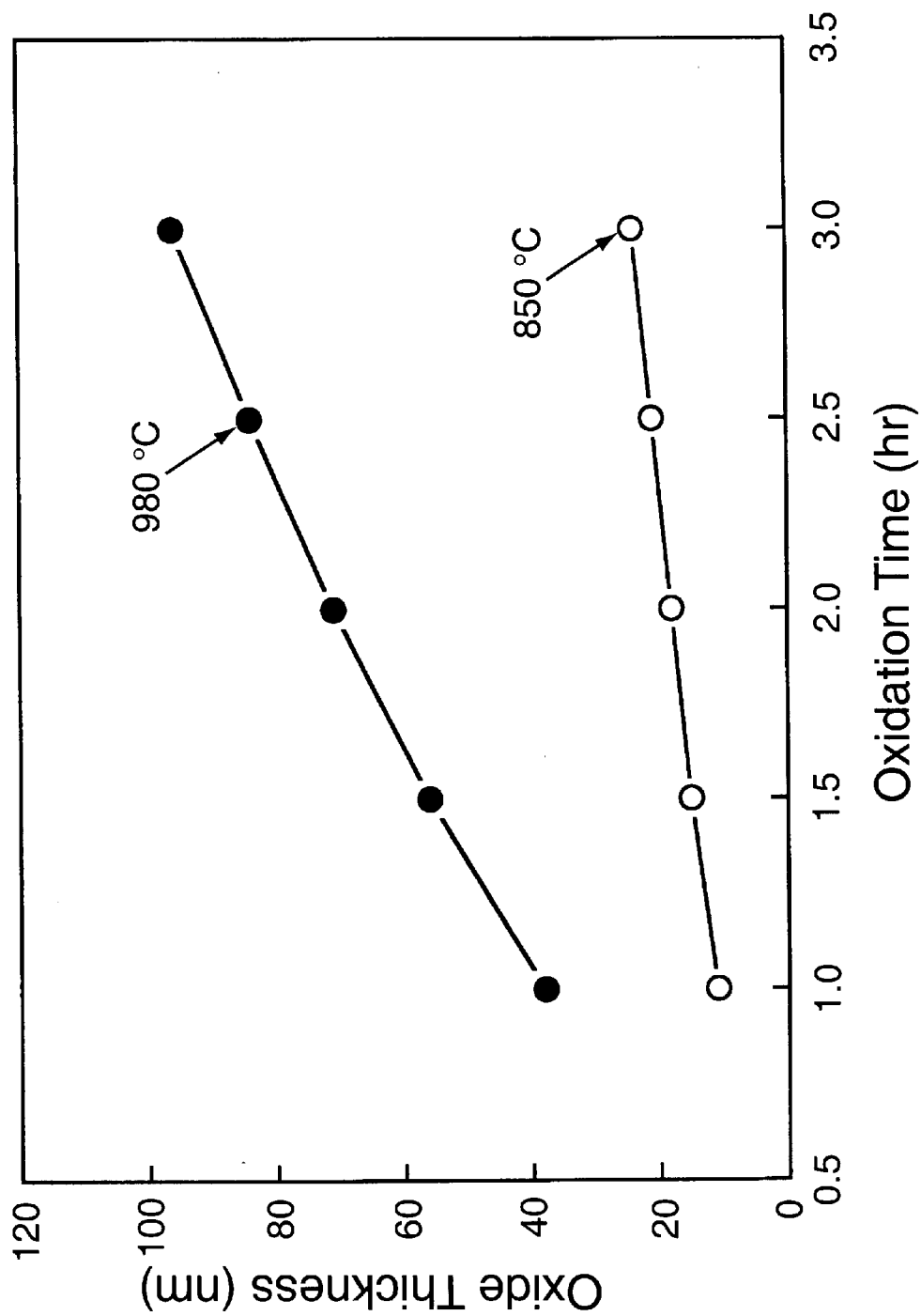
FIG. 1 is a graph plotting intermediate silicon oxide thickness between the YSZ and the silicon substrate versus oxidation time.

The present invention is concerned with a process of forming a structure including an epitaxial oxide layer of a material such as yttria-stabilized zirconia on a thick layer of amorphous silicon dioxide on single crystal, e.g., (100) silicon substrates, and to the resultant structures therefrom.

In the present process, an epitaxial oxide layer is initially formed directly on a single crystal silicon substrate and an intermediate thick layer of amorphous silicon dioxide subsequently formed in situ between the epitaxial oxide layer and the silicon substrate. The epitaxial oxide layer can generally be of any material that can be epitaxially grown on single crystal silicon substrates and which is capable of conducting oxygen, i.e., allowing oxygen to pass through the material at elevated temperatures such as from 850° C. to 1200° C. Among the suitable materials can be included, yttria-stabilized zirconia (YSZ with fluorite structure), cerium oxide (CeO$_2$ with fluorite structure), yttrium oxide (Y$_2$O$_3$ with bixbyite structure), magnesium oxide (MgO with rocksalt structure), and magnesium aluminum oxide (MgAl$_2$O$_4$ with spinel structure). Yttria-stabilized zirconia is preferred as the epitaxial oxide material.

The intermediate layer of amorphous silicon dioxide is a thick film layer, i.e., the amorphous layer has a thickness of at least about 500 Angstroms, preferably at least about 1000 Angstroms. Such thick layers of amorphous silicon dioxide are formed in situ between an epitaxial oxide layer and a single crystal silicon substrate by heating the intermediate structure, i.e., the epitaxial oxide layer on the single crystal silicon substrate, in an oxygen-containing atmosphere at temperatures of at least about 850° C., preferably at least about 950° C., for a sufficient time to form the desired silicon dioxide thickness. Generally, the temperatures are kept beneath about 1200° C. as above such temperatures undesirable distortion of the substrate may result. The epitaxial nature of the oxide material layer is maintained after the processing to form the in situ silicon dioxide layer.

By "formed in situ" it is meant that the thick layer of amorphous silicon dioxide is formed in place between the epitaxial oxide material and the single crystal silicon substrate.

The amorphous layer of silicon dioxide can be formed immediately after the deposition of the epitaxial oxide material on the single crystal silicon substrate, such immediate formation taking place within the deposition chamber without breaking vacuum. Alternatively, the amorphous layer of silicon dioxide can be formed subsequently by removing the intermediate structure of the epitaxial oxide material on the single crystal silicon substrate from the deposition chamber and subsequently heating the intermediate article at the necessary temperatures in an oxygen-containing atmosphere.

The heating of the intermediate article for oxidation of the silicon to form the silicon dioxide layer can be carried out in a dry oxygen atmosphere. Such a dry oxygen atmosphere is essentially free of any water. Alternatively, the heating of the intermediate article for oxidation of the silicon can be carried out in a wet oxygen atmosphere, i.e., an oxygen atmosphere including at least a minor portion of water. Such a "dry" oxidation generally yields a higher quality silicon dioxide layer. Such a "wet" oxidation can increase the oxidation rate and reduce the necessary time at any given temperature to obtain the desired thickness of silicon dioxide.

Additional epitaxial oxide materials can be subsequently deposited upon the first layer of epitaxial oxide material adjacent the amorphous silicon dioxide layer. For example, epitaxial layers of high temperature superconductor materials such as $YBa_2Cu_3O_x$ (YBCO) and the like can be deposited on a first layer of an epitaxial oxide material such as yttria-stabilized zirconia or cerium oxide. Likewise, epitaxial layers of ferroelectric materials can be grown or deposited on the first layer of epitaxial oxide material. Such ferroelectric materials can include barium titanate ($BaTiO_3$ also referred to as BTO), strontium titanate ($SrTiO_3$), barium strontium titanate ($Ba_xSr_{1-x}TiO_3$), bismuth titanate ($Bi_4Ti_3O_{12}$), lead zirconium titanate ($PbZr_xTi_{1-x}O_3$ also referred to as PZT), lead lanthanum zirconium titanium oxide (referred to as PLZT) and the like. Also, epitaxial layers of highly conductive metallic oxides such as ruthenium dioxide ($RuO_2$) and rutile structured conductive oxides such as iridium oxide ($IrO_2$), tin oxide ($SnO_2$) and the like or other conductive metal oxides such as lanthanum strontium cobalt oxide ($La_{0.5}Sr_{0.5}CoO_3$ also referred to as LSCO), or alkaline earth metal oxides, e.g., strontium ruthenium oxide ($SrRuO_3$ also referred to as SRO), calcium ruthenium trioxide, barium ruthenium trioxide, or mixed alkaline earth metal ruthenium oxides, can be deposited or grown on a first layer of an epitaxial oxide material such as yttria-stabilized zirconia or cerium oxide. Such epitaxial layers of metallic oxides can serve as a bottom electrode of an electronic structure. Additional epitaxial layers may be sequentially deposited on one another. For example, a structure such as epitaxial PZT on epitaxial LSCO on epitaxial $CeO_2$ on epitaxial YSZ on amorphous $SiO_2$ on single crystal Si can be sequentially formed.

Various embodiments are possible in combination with the basic substrate structure of the present invention which includes the single crystal silicon substrate, the thick layer of amorphous silicon dioxide on the silicon substrate and the epitaxial oxide material upon the silicon dioxide. In one embodiment of the present invention, a platinum electrode can be deposited upon an epitaxial YSZ layer serving as the epitaxial oxide material to yield an overall structure of Si/SiO$_2$/YSZ/Pt, such a structure useful as a high performance oxygen sensor. In another embodiment of the present invention, a silicon layer can be deposited upon an epitaxial YSZ layer serving as the epitaxial oxide material to yield an overall structure of Si/SiO$_2$/YSZ/Si, such a structure useful as a thin film silicon solar cell device. In another embodiment of the present invention, an epitaxial layer of a conductive oxide, e.g., ruthenium oxide, can be deposited upon an epitaxial YSZ layer serving as the epitaxial oxide material to yield an overall structure of Si/SiO$_2$/YSZ/RuO$_2$, such a structure useful as a detector. In another embodiment of the present invention, an epitaxial layer of a conductive oxide, e.g., ruthenium oxide, can be deposited upon an epitaxial YSZ layer serving as the epitaxial oxide material, and a thin layer of pyroelectric material deposited on the conductive oxide to yield an overall structure of Si/SiO$_2$/YSZ/RuO$_2$/pyroelectric, such a structure useful as a detector. In another embodiment of the present invention, an epitaxial layer of a conductive oxide, e.g., ruthenium oxide, can be deposited as a bottom electrode upon an epitaxial YSZ layer serving as the epitaxial oxide material, a thin layer of ferroelectric material such as PZT deposited on the conductive oxide, and a top electrode of a conductive oxide such as ruthenium oxide or of a metal such as platinum deposited upon the ferroelectric material to yield an overall structure of Si/SiO$_2$/YSZ/RuO$_2$/PZT/Pt, such a structure useful as a memory device. In another embodiment of the present invention, a thick film (>1500 Angstroms) of epitaxial YBCO can be deposited upon an epitaxial YSZ layer serving as the epitaxial oxide material to yield an overall structure of Si/SiO$_2$/YSZ/YBCO, such a structure useful as a high temperature superconductor device. In another embodiment of the present invention, an epitaxial layer of a conductive oxide, e.g., ruthenium oxide, can be deposited as a bottom electrode upon an epitaxial YSZ layer serving as the epitaxial oxide material, a thin layer of pyroelectric material such as BTO deposited on the conductive oxide, and at least a portion of the underlying silicon dioxide layer etched away thereby enhancing sensitivity of a structure useful as a detector with an overall structure of Si/SiO$_2$/YSZ/RuO$_2$/BTO.

The term "amorphous" generally refers to a non-crystalline solid structure although it is meant to include quasi-amorphous or fine nanocrystalline structures that may appear at the boundary of an amorphous layer . The term "epitaxial" generally refers to a material having an oriented crystalline arrangement.

In one preferred embodiment of the present invention, a layer of yttria-stabilized zirconia was deposited directly on a single crystal silicon substrate to form an intermediate product. Thereafter, the intermediate product was annealed for at least one hour at a temperature of 980° C. in an atmosphere of oxygen (about 0.1 milliTorr O$_2$) whereupon a thick film of amorphous silicon dioxide was formed in situ as an intermediate layer.

In FIG. I is shown the SiO$_2$ thickness between an epitaxial YSZ layer and single crystal Si with different post-annealing conditions, where the SiO$_2$ layer thickness is determined by measuring the step height with a stylus profilometer. To measure this, the YSZ layer was first removed by etching with boiling phosphoric acid; then the wafer was partially covered with photoresist and the SiO$_2$ was etched with buffered HF, which does not etch silicon. The SiO$_2$ thickness varied from about 10 nm to about 100 nm depending upon the post-annealing temperature and duration. To obtain an amorphous silicon dioxide layer of the desired minimum thickness, i.e., about 500 Angstroms, temperatures of at least about 950° C. are generally preferred to minimize the processing time.

Figure 2:
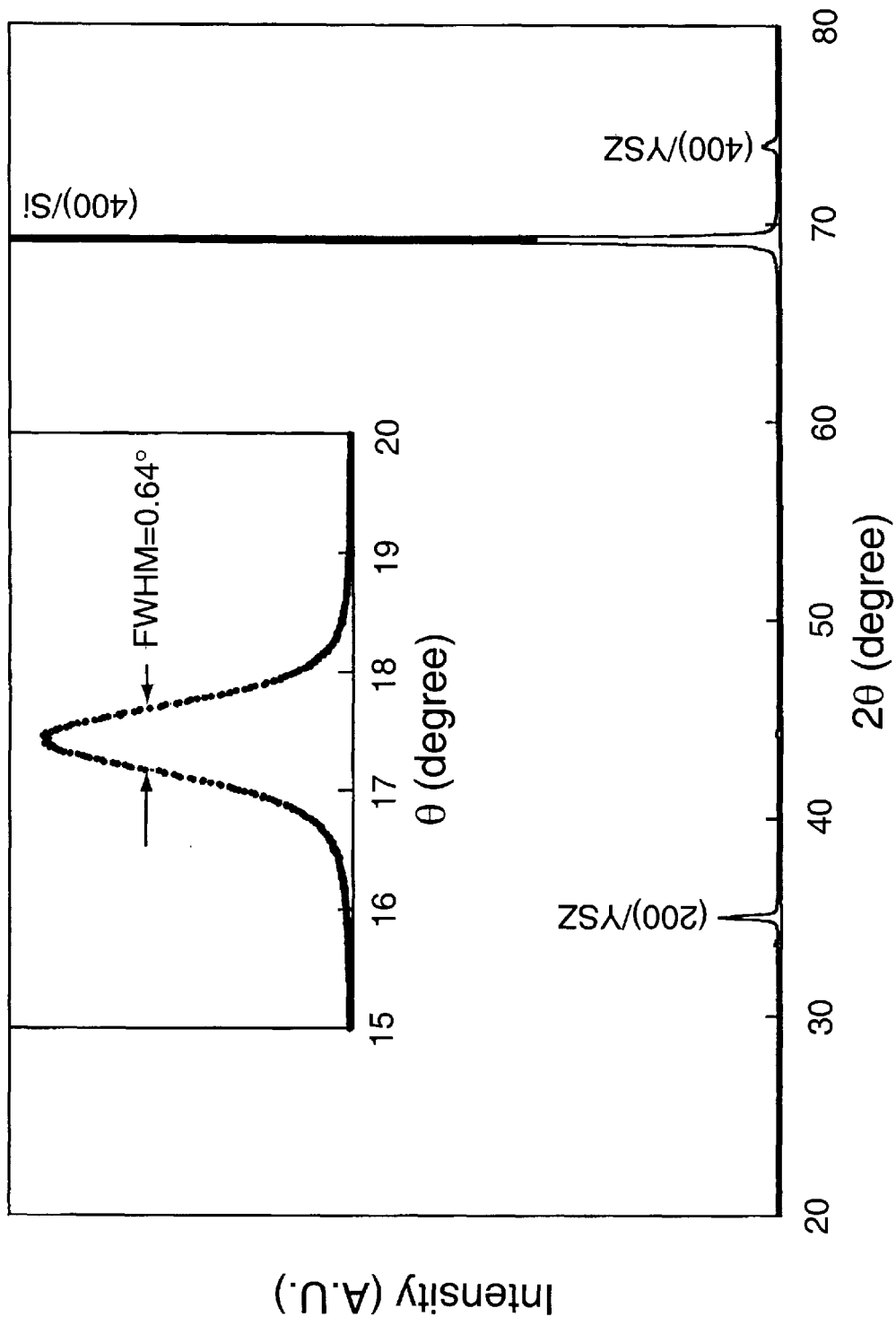
FIG. 2 is a graph plotting an X-ray diffraction scan of a YSZ/SiO$_2$ film on a silicon substrate.
Figure 3:
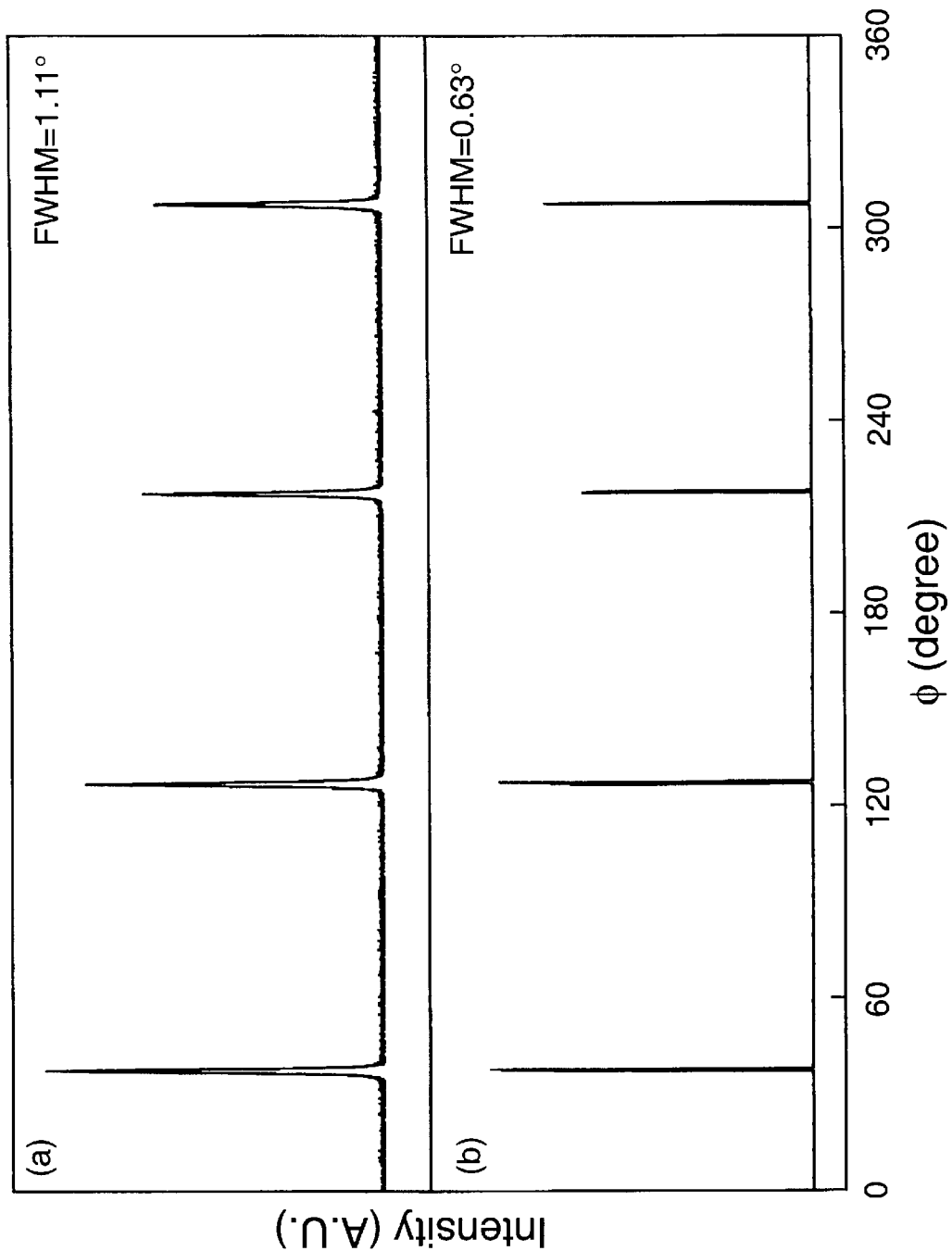
FIG. 3(a) and 3(b) are graphs plotting a X-ray diffraction scan on (202) of both (a) YSZ and (b) silicon substrate on a structure of YSZ/SiO$_2$/Si.

In FIG. 2 is shown the XRD data from a sample of YSZ/SiO$_2$/Si processed in accordance with the present invention, where the SiO$_2$ layer had a thickness of about 80 nm. Strong diffraction lines, only from (h00) of either cubic YSZ or Si, were detected from the θ–2θ scans of the films. The tilt variation in the [100] axis of the YSZ grains, based on ω-rocking curves of full width at half-maximum (FWHM) on the (200) peak of YSZ shown the inset of FIG. 2, was 0.640°. This value is better than the value obtained, e.g., by Fork et al., Appl. Phys. Lett., vol. 57, pp. 1161–1163 (1990), by Legagneux et al., Appl. Phys. Lett., vol. 53, pp. 1506–1508 (1988), by Mattee et al., Appl. Phys. Lett., vol. 61, pp. 1240–1242 (1992), and by Horita et al., Thin Solid Films, vol. 229, pp. 17–23 (1993), for YSZ films deposited directly on Si. Optimized deposition and processing conditions may contribute to such a low FWHM value. In-plane texturing of the YSZ/SiO$_2$/Si was confirmed from φ scans on the (202) peak of both Si and YSZ. As shown in FIG. 3, the YSZ layer still shows excellent in-plane alignment with respect to the (100) plane of Si because only four peaks 90° apart were observed. The in-plane twist misalignment of the YSZ grains, defined as the FWHM from the φ scan, was about 1.11° compared with that of 0.63° from the Si substrate. The XRD analysis clearly indicated that the introduction of a thick SiO$_2$ layer between the YSZ and Si by proper processing design does not destroy the cube-on-cube epitaxial nature of YSZ on Si. In comparison, YSZ thin films deposited directly on SiO$_2$ previously deposited on Si are either amorphous or polycrystalline as reported by Mogro-Campero et al., Appl. Phys. Lett., vol. 52, pp. 2068–2070 (1988).

Figure 4:
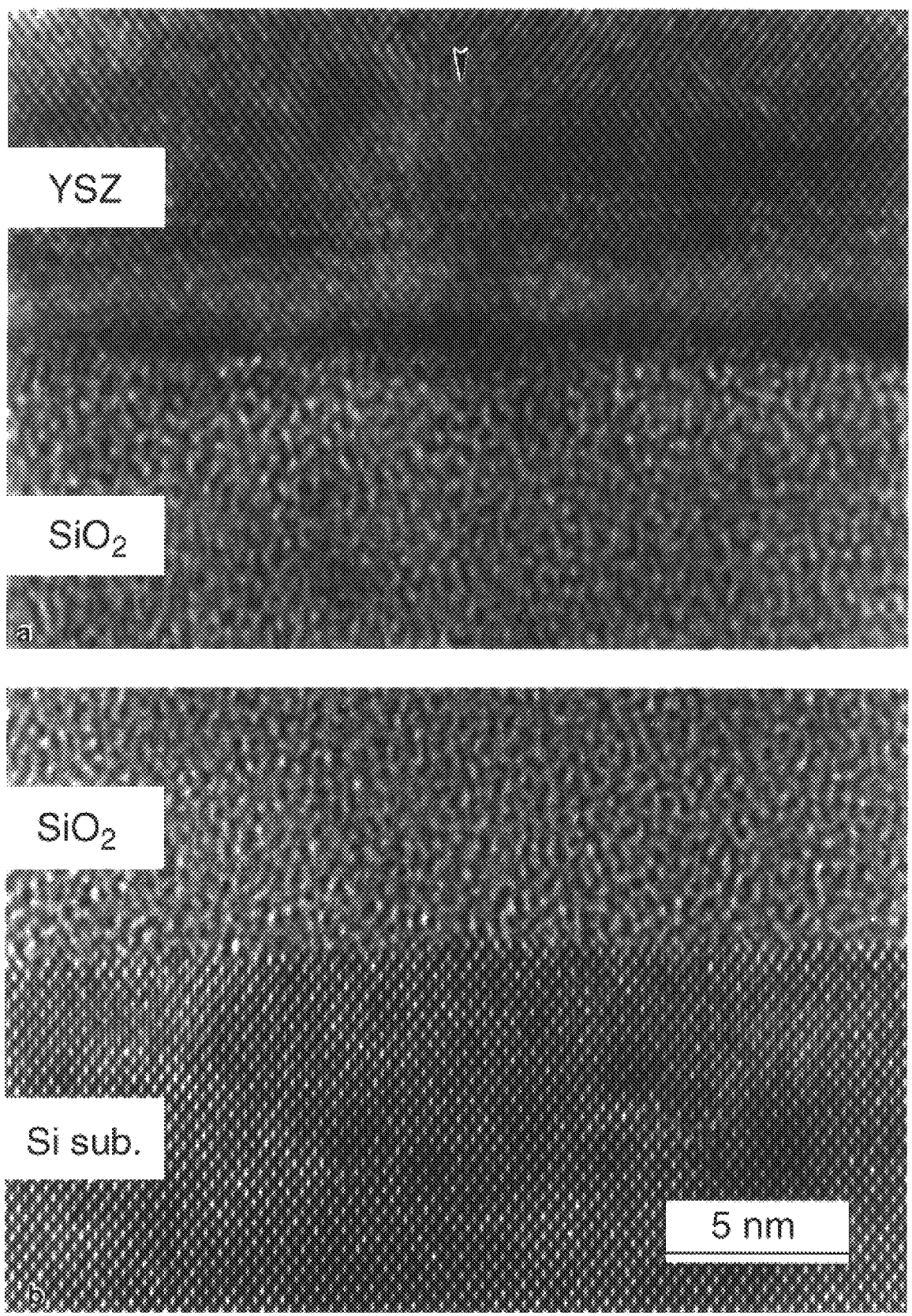
FIG. 4(a) and 4(b) show high resolution cross-sectional transmission electron micrographs of interfaces between (a) YSZ and SiO$_2$ and (b) SiO$_2$ and Si, the two images from the same sample with no change in orientation.

A HRXTEM investigation (performed with a Philips CM30 high-resolution transmission electron microscope with a point to point resolution of 0.19 um) on the YSZ/SiO$_2$/Si gives further evidence of the epitaxial nature of YSZ even after the formation of a fairly thick SiO$_2$ layer between the YSZ and Si. FIG. 4 shows the HRXTEM images containing the interfaces between YSZ/SiO$_2$ and SiO$_2$/Si. The SiO$_2$ layer was indeed amorphous. The similar lattice images from both YSZ and Si show the epitaxial relationship, which has been further confirmed by electron diffraction. Moreover, as can be seen in FIG. 4(b), the interface between Si and SiO$_2$ is atomically sharp and flat. This is expected from thermal growth of SiO$_2$ on Si. The preservation of Si surface crystallinity is crucial for the integration of active devices located on Si and other devices built above it. There were no precipitates at the SiO$_2$-Si interface for the structure of YSZ/SiO$_2$/Si prepared in accordance with the present invention, while precipitates at the YSZ/Si interface, probably a zirconium silicide formed because of diffusion of Zr into the Si have been reported for the YSZ/Si structure by Bardal et al., J. Mater. Res., vol. 8, pp. 2112–2127 (1993). The interface between YSZ and SiO$_2$, as shown in FIG. 4(a), is not as sharp as that between SiO$_2$ and Si. High dislocation densities in the YSZ are found within a distance of about 10 nm from the SiO$_2$-YSZ interface. The dislocation region is shown by the arrow in FIG. 4(a). However, the remaining YSZ layer above the interface still shows very good crystallinity and structural properties.

Figure 5:
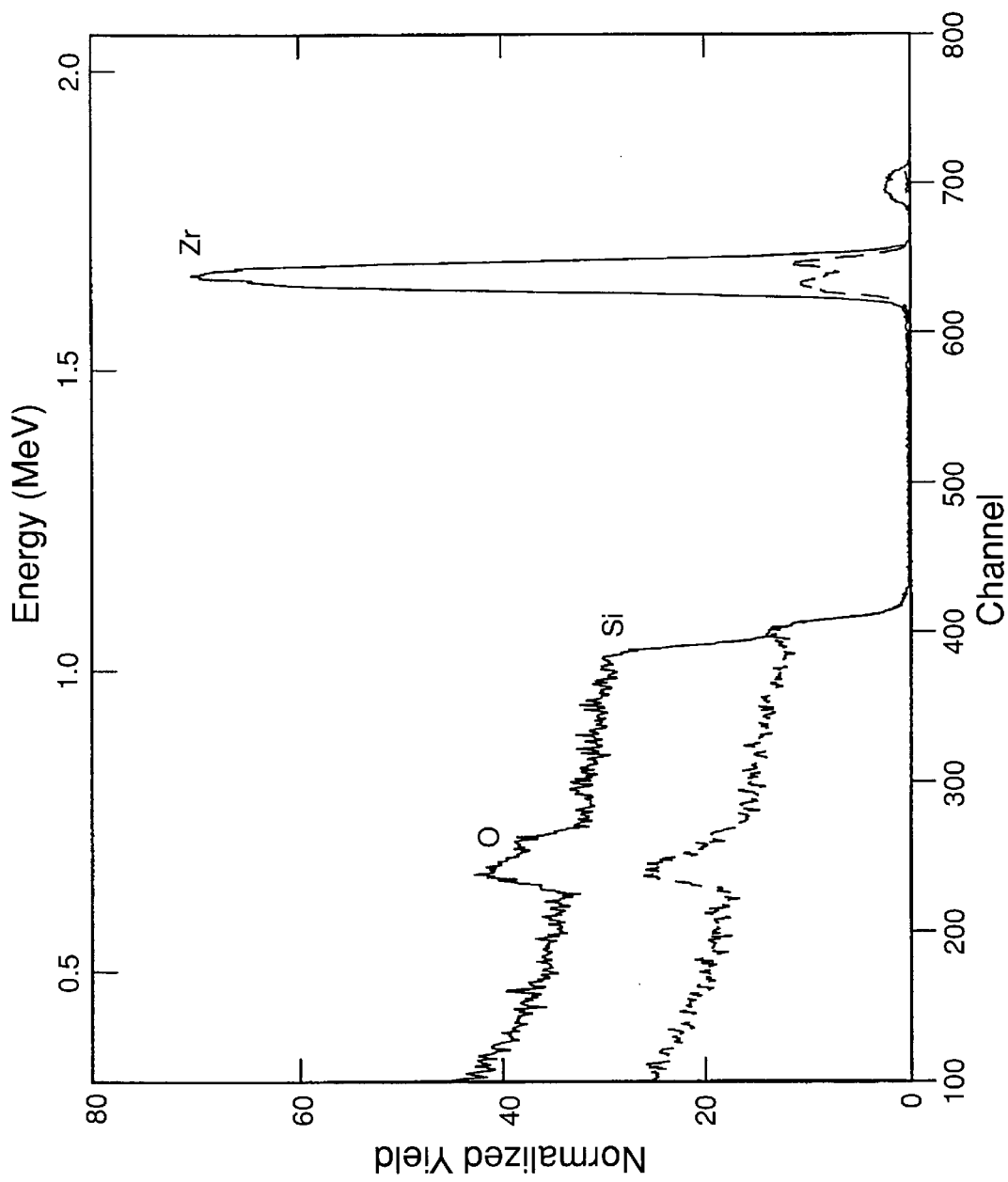
FIG. 5 is a graph plotting the Rutherford Backscattering Spectroscopy for a structure of YSZ/SiO$_2$/Si.

The degree of crystallinity of the YSZ on SiO$_2$/Si formed in such a way can be determined by ion beam channeling from RBS. FIG. 5 shows typical RBS (He+; 2.0 MeV) random and channeling spectra for a configuration of YSZ/SiO$_2$/Si, where the SiO$_2$ thickness is about 80 nm. A minimum channeling yield of around 11% was achieved on the film surface, which is comparable with that of pulsed-laser-deposited YSZ on Si, without the thick intermediate SiO$_2$ layer. This value is lower than that for YSZ directly deposited on Si by ion sputtering, where a minimum yield of around 17% was reported by Legagneux et al., Appl. Phys. Lett., vol. 53, pp. 1506–1508 (1988). The slightly higher minimum yield for the structure of YSZ/SiO$_2$/Si, compared with the value of 5.3% obtained for the YSZ/Si deposited by PLD of Fork et al., Appl. Phys. Lett., vol. 57, pp. 1161–1163 (1990), could be from dislocations introduced near the interface between YSZ and SiO$_2$ owing to higher processing temperatures used to grow the thick layer of SiO$_2$ between the YSZ and Si. It is believed that growth stresses produce dislocations in the YSZ layer.

Another important feature of the present structure of YSZ/SiO$_2$/Si compared with YSZ/Si is the improvement in the interface properties between the single crystal Si and amorphous SiO$_2$. The surface states per unit area per electronvolt at the interface located in the energy band of Si was lower because of the thermally grown amorphous SiO$_2$, compared to some insulating compounds formed by physical vapor deposition. The preservation of the Si substrate crystallinity after YSZ/SiO$_2$ formation, and in particular after epitaxial growth of high-temperature superconductor YBCO thin films on YSZ/SiO$_2$/Si has also been accomplished.

The present invention is more particularly described in the following examples which are intended as illustrative only, since numerous modifications and variations will be apparent to those skilled in the art.

EXAMPLE 1

Epitaxial growth of YSZ on silicon was accomplished by pulsed-laser deposition (PLD). A thick amorphous silicon dioxide layer was formed by post-annealing the YSZ/Si structure at a high temperature in a dry oxygen atmosphere. Single crystal borondoped (100) Si (p-type) wafers with a resistivity of from about 1 to 5 ohms-centimeters were used as substrates. The substrates were cleaned using a sequence of acetone, methanol, de-ionized water and diluted hydrofluoric acid (HF) (dilution HF:H$_2$O=1:10) solutions. The silicon wafers were kept at a temperature between about 30° C. to about 100° C. in air for about five minutes to dry the water-based silver paint (used to glue the individual wafers on a substrate holder) before transferring them into a vacuum chamber for YSZ film deposition. The YSZ thin films were deposited at a substrate temperature of 800° C. by PLD using a 308 nanometer (nm) XeCl excimer laser operated at repetition rates of 5 Hz and producing 20 nanosecond (ns) pulses with energy densities of 2 joules per square centimeter (J/cm$^2$). To prevent oxidation of the silicon surface during the early stages of YSZ growth, no oxygen was introduced into the deposition chamber during the first 5 nm of YSZ growth, which was maintained at a pressure of about 5×10$^{-5}$ Torr. An oxygen pressure of 1 millitorr (mT) was maintained in the deposition chamber for the remaining YSZ layer deposition. A total YSZ layer deposition layer thickness of around 50 nm was generally deposited. A detailed experimental set-up has been previously described by Wu et al., Appl. Phys. Lett., vol. 58, no. 19, pp. 2165–2167 (1991), "Epitaxial CeO$_2$ Films as Buffer Layers for High-Temperature Superconducting Thin Films", such description hereby incorporated by reference.

The YSZ/Si wafers were subjected to post-annealing at temperatures of 850° C. and 980° C. under dry oxygen at one atmosphere for pre-selected times. The structural properties of the YSZ were characterized by X-ray diffraction (XRD) θ–2° scans, ω-rocking curves and φ scans. The crystallinity of the films was further tested with ion beam channeling by Rutherford backscattering spectrometry (RBS) and high-resolution cross-sectional transmission electron microscopy (HRXTEM) analysis.

A multilayer structure of single-crystal YSZ on amorphous $SiO_2$ on Si was successfully realized by thermal treatment of YSZ/Si in oxygen. Oxidation of Si takes place on the Si surface owing to the high diffusivity of oxygen in YSZ at the elevated temperatures. The introduction of a fairly thick $SiO_2$ layer between single-crystal YSZ and Si by proper processing design maintains the cube-on-cube epitaxial nature of YSZ on Si. The structural properties of the YSZ in the $YSZ/SiO_2/Si$ configuration are comparable with those of YSZ deposited directly on Si. The well preserved Si surface with a configuration of single-crystal YSZ on quite a thick amorphous $SiO_2$ layer may provide new structures for fabricating solid state electronic devices.

EXAMPLE 2

Crystalline $RuO_2$ thin films were deposited on (100) Si substrates having an intermediate layer of YSZ. Both the YSZ and $RuO_2$ crystalline thin films or layers were grown in situ by PLD with a 308 nm XeCl excimer laser. The PLD was operated as in example 1 with repetition rates of from 2–10 Hz. The Si substrates were cleaned and the YSZ layer grown on the Si substrate as in example 1.

To demonstrate that crystalline $RuO_2$ thin films could be grown on the crystalline YSZ, the $RuO_2$ layer was deposited by switching the target without breaking the vacuum.

The $RuO_2$ target was a pellet made from $RuO_2 \times H_2O$ powder. The target was prepared in accordance with the description of Jia et al., J. Mater. Res., vol. 10, pp. 2041–2043 (1995), such description hereby incorporated by reference. The deposition temperature for the $RuO_2$ layer was varied from room temperature to 800° C. The oxygen pressure was optimized and then maintained at 0.5 mTorr for successive preparations. The nominal $RuO_2$ film thicknesses were from about 120 to about 150 nm. The structural properties of the $RuO_2$ films were characterized by x-ray diffraction measurements using a Siemens D5000 four circle diffractometer with Cu Kα radiation. The thin films with optimized deposition conditions were examined by cross-sectional transmission electron microscopy. The resistivity and the residual resistance ratios ($RRR=R_{300}$ $K/R_{4.2}$ K) of the $RuO_2$ thin films were measured by means of a four-probe measurement.

Although the present invention has been described with reference to specific details, it is not intended that such details should be regarded as limitations upon the scope of the invention, except as and to the extent that they are included in the accompanying claims.

What is claimed is:

1. A structure comprising:
   a single crystal silicon substrate;
   an amorphous layer of silicon dioxide adjacent said single crystal silicon substrate, said amorphous layer having a thickness of at least about 500 Angstroms; and,
   a layer of epitaxial oxide material adjacent said amorphous layer of silicon dioxide, said layer of epitaxial oxide material about 50 nm in thickness.

2. The structure of claim 1 wherein said epitaxial oxide material is selected from the group consisting of yttria-stabilized zirconia, cerium oxide, yttrium oxide, magnesium oxide and magnesium aluminum oxide.

3. The structure of claim 1 wherein said epitaxial oxide material is yttria-stabilized zirconia.

4. The structure of claim 1 wherein characterized in that said amorphous layer of silicon dioxide is formed in situ.

5. The structure of claim 1 further including an electrode contact adjacent said layer of epitaxial oxide material.

6. The structure of claim 5 wherein said electrode contact is an epitaxial conductive oxide and said epitaxial oxide material is selected from the group consisting of yttria-stabilized zirconia, cerium oxide, yttrium oxide, magnesium oxide and magnesium aluminum oxide.

7. The structure of claim 1 further including a ferroelectric material adjacent said layer of epitaxial oxide material.

8. The structure of claim 7 wherein said ferroelectric material is epitaxial.

9. The structure of claim 1 further including a high temperature superconductive material adjacent said layer of epitaxial oxide material.

10. The structure of claim 9 wherein said high temperature superconductive material is epitaxial.

11. The structure of claim 1 wherein said epitaxial oxide material is selected from the group consisting of yttria-stabilized zirconia, cerium oxide, yttrium oxide, magnesium oxide and magnesium aluminum oxide and said structure further includes a layer of epitaxial conductive oxide adjacent said layer of epitaxial oxide material, and a ferroelectric material adjacent said layer of epitaxial conductive oxide.

12. The structure of claim 11 wherein said epitaxial conductive oxide is ruthenium oxide.

13. The structure of claim 12 wherein said ferroelectric material is barium titanate.

14. The structure of claim 1 wherein said amorphous layer of silicon dioxide has a thickness of at least about 1000 Angstroms.

15. A process of forming a structure including a single crystal silicon substrate, an amorphous layer of silicon dioxide adjacent said single crystal silicon substrate, and, a layer of epitaxial oxide material adjacent said amorphous layer of silicon dioxide, said process comprising:
   depositing a layer of epitaxial oxide material selected from the group cositing of yttria-stabilized zirconia, ceium oxide, yttyium Loxide, magfenim-oxide and magnesium aluminum oxide on a single crystal silicon substrate to form an intermediate structure; and,
   heating said intermediate structure in an oxygen-containing atmosphere at temperatures from about 900° C. to about 1200° C. whereby a layer of amorphous silicon dioxide of at least about 500 Angstroms is formed in situ between said single crystal silicon substrate and said layer of epitaxial oxide material.

16. The process of claim 15 wherein said amorphous layer of silicon dioxide has a thickness of at least about 1000 Angstroms.

17. The process of claim 15 wherein said epitaxial oxide material is yttria-stabilized zirconia.

* * * * *